United States Patent [19]

Halliwell et al.

[11] Patent Number: 4,578,157
[45] Date of Patent: Mar. 25, 1986

[54] LASER INDUCED DEPOSITION OF GAAS

[76] Inventors: Michael J. Halliwell, 4435 Willow Mist Dr., Dayton, Ohio 45424; Joseph Zahavi, Technion Research & Development Foundation, Ltd., Israel Institute of Metals, Haifa, Technion City, Israel

[21] Appl. No.: 657,098

[22] Filed: Oct. 2, 1984

[51] Int. Cl.⁴ .............................................. C25D 5/02
[52] U.S. Cl. ...................................................... 204/15
[58] Field of Search ................ 204/15, DIG. 3, 224 R

[56] References Cited

U.S. PATENT DOCUMENTS

| | | | |
|---|---|---|---|
| 3,013,955 | 12/1961 | Roberts | 204/15 |
| 3,506,545 | 4/1970 | Garwin | 204/15 |
| 3,529,961 | 9/1970 | Schaefer | 204/15 |
| 3,762,938 | 10/1973 | Ridenour et al. | 117/63 |
| 4,144,139 | 3/1979 | Durkee | 204/15 |
| 4,217,183 | 8/1980 | Melcher | 204/224 R |
| 4,239,789 | 12/1980 | Blum et al. | 427/53.1 |
| 4,251,327 | 2/1981 | Grenon | 204/DIG. 3 |
| 4,324,854 | 4/1982 | Beauchamp et al. | 430/296 |
| 4,340,617 | 7/1982 | Deutsch et al. | 427/53.1 |
| 4,349,583 | 9/1982 | Kulynych et al. | 427/53.1 |
| 4,399,004 | 8/1983 | Buckley | 204/15 |
| 4,425,196 | 1/1984 | Bessette | 204/15 |

Primary Examiner—T. M. Tufariello
Attorney, Agent, or Firm—Donald J. Singer; Charles E. Bricker

[57] ABSTRACT

A method for high resolution maskless deposition of metals onto GaAs without application of an electrical potential by contacting a GaAs workpiece with an electroplating solution and directing a laser beam through the solution onto the GaAs to locally achieve plating.

10 Claims, 1 Drawing Figure

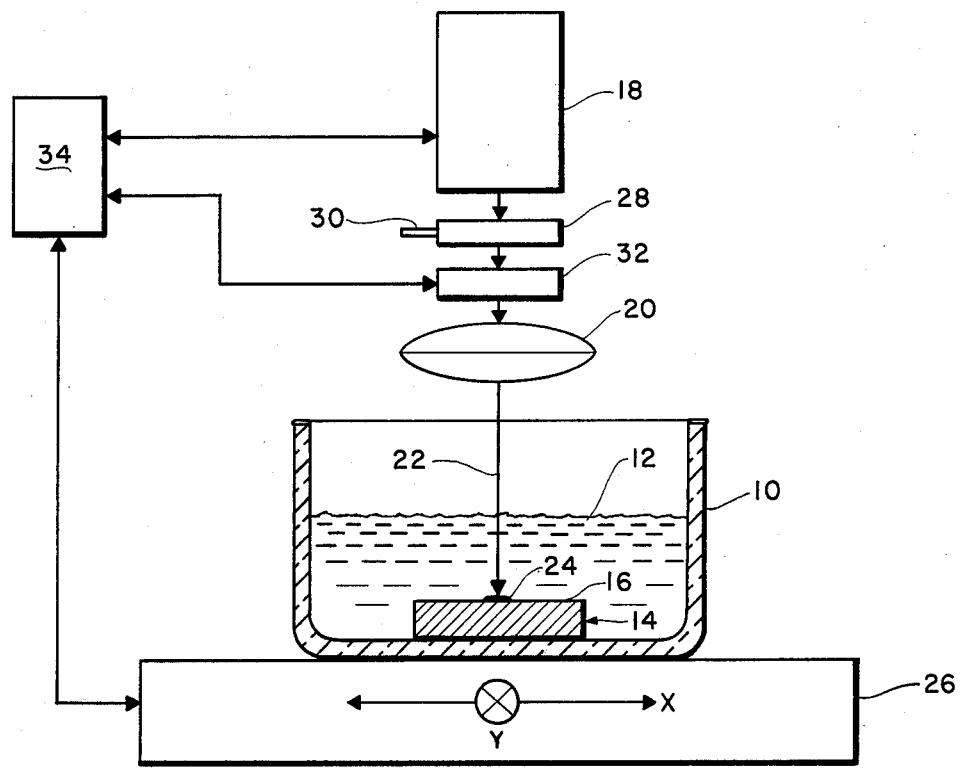

LASER INDUCED DEPOSITION OF GAAS

RIGHTS OF THE GOVERNMENT

The invention described herein may be manufactured and used by or for the Government of the United States for all governmental purposes without the payment of any royalty.

BACKGROUND OF THE INVENTION

This invention relates to a method for laser-induced metallization on semiconductor substrates.

While it is possible to produce high resolution patterns by deposition techniques wherein masking is employed to delineate the pattern, such plating processes require multiple steps. It is necessary to employ a photoresist to mask the surface, to selectively expose the photoresist mask, to plate the surface and finally, to strip the mask. This process is a multistep process.

It is known to expose an electroless plating solution to a high intensity light source to enhance the plating rate. While this technique increases the plating rate, it is not well suited for preferentially plating patterns since there will be mixing of the activated solution with the nonactivated solution. This mixing will reduce the resolution of any resulting pattern.

It is also known to coat a surface to be plated with a sensitizing solution. The coated surface is exposed to light to form a catalytic layer capable of catalyzing the deposition of metal thereon from an electroless metal deposition solution. Again, this technique suffers from the limitation of being a multistep process and requires a light activated catalytic layer.

Ridenour et al, in U.S. Pat. No. 3,762,938, describe a process for depositing elemental metallic coatings on solid substrates which comprises forming a hydride of the metal to be deposited in situ on a substrate and subjecting the metal hydride to sufficient energy to deposit the elemental form of the metal on the substrate. The source of energy may be heat, actinic light or high energy radiation, such as electron bombardment. This technique suffers from being a multistep process.

Beauchamp et al, U.S. Pat. No. 4,324,854, describe a process for depositing a thin film of material such as a metal onto a substrate through photodissociation of a gaseous compound capable of electron capture dissociation, such as a metal carbonyl. Deutsch et al, U.S. Pat. No. 4,340,617, describe a process for depositing a thin film of material such as metal onto a substrate through laser induced photolytic decomposition of a gaseous compound, such as organo-metallics, metal carbonyls, metal halides and the like. These techniques suffer from the relative complexity of the apparatus required.

Blum et al, U.S. Pat. No. 4,239,789, describe a process for depositing a metal onto a workpiece comprising a thin layer of metal or an active layer of solution such as palladium chloride which comprises contacting the surface with an electroless plating solution and directing an energy beam onto the workpiece to locally heat the surface to promote enhanced plating. Kulynych et al, U.S. Pat. No. 4,349,583, describe a similar process wherein the plating solution does not contain a reducing agent. These patents do not address the plating of metals onto non-metallic surfaces.

Accordingly, it is an object of the present invention to provide a method for selectively plating onto the surface of a non-metallic workpiece.

Other objects and advantages of the present invention will be apparent to those skilled in the art from a reading of the following description of the invention.

SUMMARY OF THE INVENTION

In accordance with the present invention there is provided a method for selectively plating onto a GaAs workpiece without application of an electrical potential source which comprises the steps of contacting the workpiece with an electroplating solution and directing a coherent energy beam onto the workpiece to locally promote plating thereon.

BRIEF DESCRIPTION OF THE DRAWING

The drawing shows a schematic of an energy source directed through a lens onto a workpiece located in a container holding an electroplating solution.

DESCRIPTION OF THE INVENTION

Referring to the drawing, there is shown in FIG. 1 a vessel 10 which contains an electroplating solution 12. The GaAs workpiece 14 is immersed in plating solution 12 so as to cause the surface 16 where plating is desired, to be contacted by plating solution 12. A laser energy source 18 is focused by a lens system 20 to concentrate the energy and focus a beam 22 which passes through the plating solution 12 and impinges on the surface 16. A pattern 24 can be generated by moving the beam 22 or the workpiece using an xy table 26. A filter holder 28 for holding one or more absorbing filters 30 may be interposed in the light path between energy source 18 and lens system 20.

The beam 22 emitted from the energy source 18 may be modulated by a modulator 32 which may, if desired, be placed between the energy source 18 and the lens system 20, or alternatively between the lens system 20 and the workpiece 14. The modulator 32 may be a mechanical light chopper when the modulation rate is low or an optical modulator can be employed when more rapid modulation is desired. Optical modulation allows frequencies up to the gigahertz range.

The laser energy source 18 may be any known laser source which provides light in the range of visible to far infrared, preferably in the near infrared, and has an intensity sufficient to provide a beam 22 with an intensity in the approximate range of 0.05 to 5.0 joule/cm$^2$, preferably about 0.1 to 2.0 joule/cm$^2$. Thus, the laser energy source 18 may be an argon laser, tuned to about 0.5 $\mu$m or, preferably, a pulsed radiation beam, typically a Q-switched neodymium yttrium aluminum garnet (Nd:YAG) laser, is used. As used herein, the terms "pulsed radiation" and "pulsed laser" refer to radiant energy sources that produce discrete energy pulses as a function of time. These terms are not descriptive of, or limiting to, the method of achieving such energy pulses. For example, "pulsed laser" includes capacitor-switched lasers, Q-switched lasers, and the like.

Laser energy density upon the workpiece can be easily controlled and changed by inserting absorbing optical filters 30 between the source 18 and the lens system 20. Such filters are available commercially from a variety of sources.

The plating solution 12 may be any commercially available plating solution commonly used for the electroplating of metals onto a conductive substrate. Examples of electroplating solutions include potassium-gold-cyanide solution, nickel-palladium solution, and the like. Periodic replenishment of the metal ions is necessary.

The xy table 26, and the laser energy source 18 or the modulator 32 may be controlled by a controller 34, which may be a microprocessor computer controller, a mechanical controller or other controlling means.

Deposition of the desired metal from solution onto the GaAs workpiece is carried out by immersing the workpiece 14 in the plating solution 12 in container 10 so that there is about 1-2 mm of liquid over the surface 16. The solution 12 is maintained at room temperature and no external power is applied. The laser beam 22 is focused upon surface 16 to obtain a spot diameter of about 0.25 to 2 mm, preferably about 0.5 to 0.75 mm. The xy table is set up to step in the x and/or y direction with about 95 to 50 percent spot overlap at a lineal rate of about 15-25 cm/min. Alternatively, the xy table may be set up to move in continuous fashion.

The GaAs substrate can be intrinsic, p-doped, such as with Zn, or n-doped, such as with Te, as is shown in the art.

The following examples illustrate the invention. Experimental Set-Up:

The system used was similar to that shown schematically in FIG. 1. The laser system was a Q-switched Nd:YAG laser having a wavelength of 0.53 $\mu$m, pulse duration of 15 ns and a repetition rate of 1.0 Hz. Laser energy density ranged from 0.164 to 2.0 joule/cm$^2$ with energy densities below 1.0 being provided by the use of absorbing filters.

A computer was employed to control the traverse of the xy table. The table was run at 20 cm/min and a delay was inserted in the computer program so as to make the table step at intervals of 5 to 50% of the diameter of the laser beam and stop until the next laser pulse. This method provided 95 to 50% overlapped spots.

Materials

GaAs (100) specimens were prepared to provide flat squares 15×15 mm. The GaAs semiconductor substrates were intrinsic, n and p doped (100) as follows:

Intrinsic—GaAs Undoped (100) ($p = 10^7$ ohm cm)

n—GaAs Te-doped (100) ($p = 2.1 \times 10^{-3}$ ohm cm)

p—GaAs Zn-doped (100) ($p = 5.5 \times 10^{-3}$ ohm cm

The electroplating solution was a commercially available potassium-gold-cyanide solution.

Plating Procedure

The GaAs (100) specimens were immersed in the gold plating solution with about 1 mm of solution over the top surface of the specimen. The solution was at room temperature and no external power was used. The specimen surfaces were irradiated under various conditions and at various locations according to desired preplanned program.

The plating conditions are shown in the following table:

| Laser Energy Density (joule/cm 2) | Beam Diameter (mm) | Pulse Duration (ns) | Absorption Filter Used (% Absorption) | No. of Pulses per Position | Pulse Overlap (%) |
| --- | --- | --- | --- | --- | --- |
| 2.0 | 0.6 | 15 | — | 1 | 50 |
| 1.0 | 0.6 | 15 | — | 1 | 50 |
| 0.8 | 0.6 | 25 | 20 | 1 | 50 |
| 0.5 | 0.6 | 15 | 50 | 1 | 50 |
| 0.3 | 0.6 | 15 | 70 | 1 | 50 |
| 0.308 to 0.315 | 0.6 | 15 | 70 | 1 | 50 |
| 0.249 to 0.253 | 0.6 | 15 | 75 | 1 | 95 |
| 0.164 to 0.168 | 0.6 | 15 | 85 | 1 | 95 |

Deposit Morphology and Composition

A scanning electron microscope (SEM) was used to examine the deposits of gold on GaAs. It was found that laser-induced gold deposition resulted in uniform continuous and well defined plated areas (lines) of gold. In general, the gold deposit was proportional to the laser energy applied. Further, it was found that the gold deposition occurred without substantial damage to the GaAs workpiece when the laser energy density was 0.3 joule/cm$^2$ or below.

It was also found that the electrical resistance of the deposited lines decreased with increases in laser energy density, with a minimum resistance (less than 1 ohm) obtained at a laser energy of about 0.31 joules/cm$^2$. The gold-deposited p-type GaAs exhibited Schottky contact behavior. The gold-deposited lines exhibited linear ohmic behavior.

Various modifications may be made without departing from the spirit of the invention or the scope of the appended claims.

We claim:

1. A method for selectively plating a metal onto a gallium arsenide substrate without application of an electrical potential source which comprises the steps of:
   (a) contacting said gallium arsenide with an electroplating solution; and
   (b) directing a focused laser beam having an intensity between about 0.05 joule/cm$^2$ and 5.0 joule/cm$^2$ and a focused spot diameter between about 0.25 and 2 mm through said solution onto said gallium arsenide to locally achieve plating thereon.

2. The method of claim 1 additionally comprising the step of moving said beam to achieve a plated pattern.

3. The method of claim 1 additionally comprising the step of moving said substrate to achieve a plated pattern.

4. The method of claim 1 wherein substrate is moved in a continuous fashion to achieve a continuous plated pattern.

5. The method of claim 1 wherein said beam is modulated.

6. The method of claim 1 wherein said laser beam is pulsed.

7. The method of claim 1 wherein the laser source is a Q-switched neodymium yttrium aluminum garnet laser.

8. The method of claim 1 wherein said gallium arsenide is undoped and said solution is a gold electroplating solution.

9. The method of claim 1 wherein said gallium arsenide is p-type and said solution is a gold electroplating solution.

10. The method of claim 1 wherein said gallium arsenide is n-type and said solution is a gold electroplating solution.

* * * * *